(12) United States Patent
Vilander et al.

(10) Patent No.: US 8,666,012 B2
(45) Date of Patent: Mar. 4, 2014

(54) OPERATING A FREQUENCY SYNTHESIZER

(75) Inventors: Ari Vilander, Kerava (FI); Liangge Xu, Espoo (FI); Jounl Kristian Kaukovuori, Vantaa (FI)

(73) Assignee: Broadcom Corporation, Irvine, CA (US)

( * ) Notice: Subject to any disclaimer, the term of this patent is extended or adjusted under 35 U.S.C. 154(b) by 179 days.

(21) Appl. No.: 13/277,305

(22) Filed: Oct. 20, 2011

(65) Prior Publication Data

US 2013/0099829 A1      Apr. 25, 2013

(51) Int. Cl.
  *H03D 3/24*      (2006.01)
(52) U.S. Cl.
  USPC ....... 375/375; 455/76; 455/165.1; 455/183.2; 327/105; 708/271
(58) Field of Classification Search
  USPC ................. 375/224, 375, 377; 455/76, 165.1, 455/183.1, 183.2, 260; 708/271; 327/105
  See application file for complete search history.

(56) References Cited

U.S. PATENT DOCUMENTS

| | | |
|---|---|---|
| 7,180,377 B1 | 2/2007 | Leong et al. |
| 7,969,248 B1 | 6/2011 | Whitten et al. ................. 331/16 |
| 2005/0226357 A1 | 10/2005 | Yoshumura |
| 2006/0226916 A1 | 10/2006 | Florescu |
| 2007/0146083 A1 | 6/2007 | Hein et al. ...................... 331/16 |
| 2008/0002801 A1 | 1/2008 | Droege et al. |
| 2008/0106340 A1* | 5/2008 | Lee et al. ......................... 331/16 |
| 2009/0039973 A1* | 2/2009 | Kitayama et al. ........... 331/36 C |
| 2010/0060366 A1 | 3/2010 | Chen .............................. 331/44 |
| 2010/0207693 A1 | 8/2010 | Fagg .............................. 331/10 |
| 2012/0139587 A1* | 6/2012 | Drago et al. .................. 327/106 |

OTHER PUBLICATIONS

Tsung-Hsien Lin et al: "A 900-MHz 2.5-mA CMOS Frequency Synthesizer with and Automatic SC Tuning Loop" IEEE Journal of Solid-State Circuts, IEEE Service Center, Piscataway, NJ, USA, vol. 36, No. 2, Mar. 1, 2001, XP011061469; ISSN: 0018-9200; abstract figure 3.

* cited by examiner

*Primary Examiner* — Jean B Corrielus (57) ABSTRACT

An apparatus and method for operating a frequency synthesizer wherein a value of an first control signal associated with a fine frequency feedback loop connected to a signal generator is monitored, and a second control signal associated with a medium or coarse frequency feedback loop connected to the signal generator is adjusted based on the monitoring. The first and second control signals are then output to control the frequency synthesizer.

20 Claims, 5 Drawing Sheets

OPERATING A FREQUENCY SYNTHESIZER

CROSS REFERENCE TO RELATED APPLICATION

This application claims benefit under 35 U.S.C. §119(a) and 37 CFR 1.55 to UK Patent Application GB1118128.6, filed on Oct. 20, 2011 and entitled "An Improved Method for Cell Search and Synchronization".

FIELD OF THE INVENTION

The present invention relates to systems and methods for operating a frequency synthesizer and in particular to systems and methods for operating a frequency synthesizer with a short locking time.

BACKGROUND

Many wireless transceivers, such as those used in mobile communications, use a frequency synthesizer. The frequency synthesizer creates an electrical waveform, typically a varying voltage, with a desired frequency, amplitude and waveform, which may be used in, for example, frequency translations. In particular a frequency synthesizer may be used to tune a transceiver, enabling it to send and receive communications on a number of selected channels, each operating at a different central frequency.

A typical frequency synthesizer used in a wireless transceiver includes a variable oscillator linked to a feedback circuit (typically a phase locked loop or PLL). The feedback signal maintains the oscillator at a desired frequency. The feedback circuit is typically provided with two inputs: a reference clock signal from a stable oscillator (for example a fixed frequency crystal oscillator) and a frequency control signal which identifies the target frequency (typically as a fraction or multiple of the stable oscillator frequency).

Figure 1A:
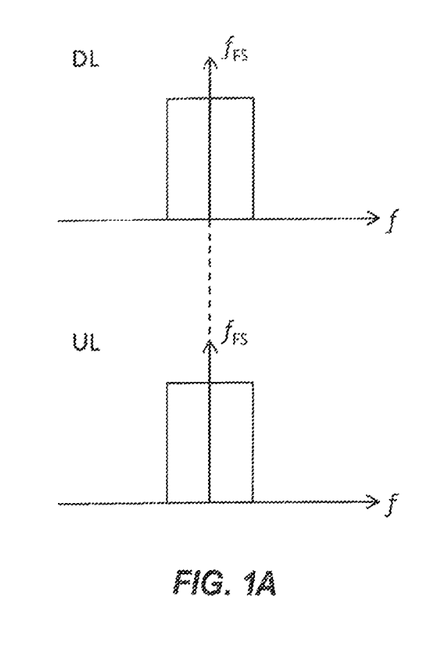
FIG. 1A shows a frequency diagram for one uplink carrier and one downlink carrier that share channel resources on a time division basis and are located at a same central frequency.

One example of a communications standard in which a frequency synthesizer may be used is Time Division-Long Term Evolution (TD-LTE). In this standard, a typical configuration is where one uplink (UL) carrier and one downlink (DL) carrier share the same channel. This means that both carriers are located at the same central frequency, and share the resources of the channel on a time division basis (i.e. alternating use with time). Such an arrangement, showing the frequency allocations to both uplink (UL) and downlink (DL) carriers, is shown in FIG. 1A.

To send and receive on this channel, the wireless transceiver will generally tune the frequency synthesizer (also known in such cases as a local oscillator) to the central frequency of the carriers. As shown in FIG. 1, this central frequency ($f_{FS}$) is the same for both channels. In TD-LTE, a transceiver will rapidly change between uplink and downlink.

Recently it has been proposed to use multiple component carriers to improve data rates for the upload and download links. These carriers may not be paired, that is there may be a different number of uplink carriers (UL) to downlink carriers (DL). Equally, component carriers may be activated or deactivated during a session, changing the number of carriers used. For example, 1 UL may be used with 2, 3 or 4 DLs. Alternatively, 2 ULs may be used with 3 DLs. Other arrangements will be possible.

To communicate using a group of uplink or downlink component carriers, the transceiver will typically tune the frequency synthesizer to a central frequency of the group. For example, if two downlink carriers are to be used, the frequency synthesizer may be tuned to a frequency between the two carriers. If three carriers are used, the frequency synthesizer may be tuned to a central frequency of the central one of the three carriers.

In some cases, in particular when the number of uplink component carriers is different from the number of downlink component carriers, the central frequency of the uplink component carrier(s) will be different from the central frequency of the downlink component carrier(s). This will be illustrated in a simple case of one uplink carrier, and two downlink carriers. In this case the single uplink carrier is aligned with one or other of the two downlink carriers, and thus the central frequency of the uplink carrier is different from the central frequency of the two downlink carriers.

Figure 1B:
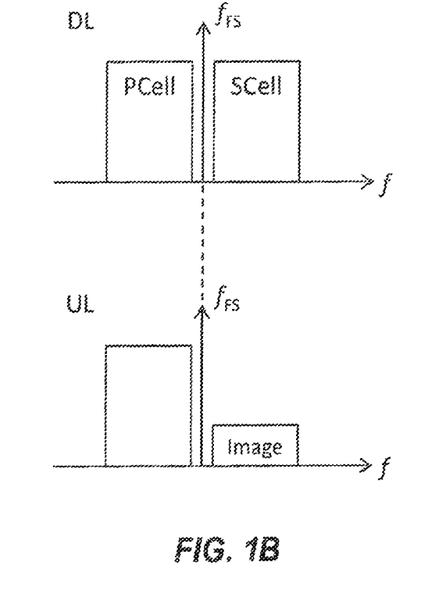
FIG. 1B shows a frequency diagram for one uplink carrier and two downlink carriers that share channel resources on a time division basis and are located at a same central frequency.

As illustrated in FIG. 1B, it may be possible to maintain the frequency synthesizer at the same frequency for both uplink and downlink component carriers. However, this leads to an image of the reflection of the uplink carrier appearing, as shown in FIG. 1B. This is detrimental to performance, and may result in the transceiver failing regulatory standards.

Figure 1C:
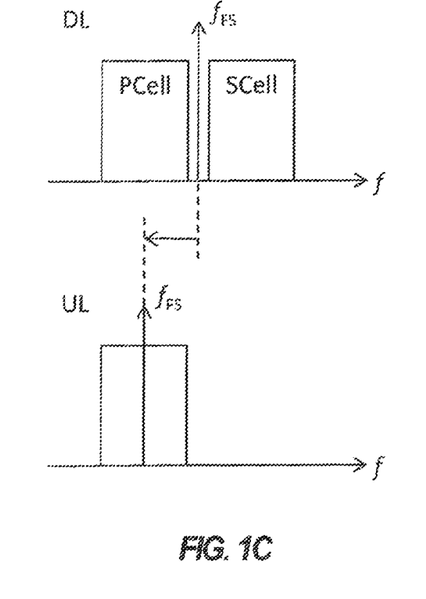
FIG. 1C shows a frequency diagram for one uplink carrier and two downlink carriers that share channel resources on a time division basis and are located at different central frequencies.

An alternative option, as illustrated in FIG. 1C, is to use a different central frequency for the uplink and downlink carriers. This may be done by using two frequency synthesizers, one for the uplink central frequency, the other for downlink. However this is a complex solution and has a higher power consumption than a solution with a single frequency synthesizer. Moreover, the two frequency synthesizers may 'pull' each other; that is, they may converge in frequency unless carefully designed.

An alternative to using two frequency synthesizers is to use a single frequency synthesizer which is able to change frequency so as to be aligned with the central frequency of both the uplink and downlink carriers. While this prevents an image being created, it requires the frequency synthesizer to change frequencies at a fast rate.

When a frequency synthesizer changes frequencies (caused by the frequency control word being changed), there is a delay before the output frequency of the frequency synthesizer settles on the new frequency. This delay is known as the locking time. Typically, the locking time of a frequency synthesizer used in mobile communications is in the region of 100-150 μs. However, to be effective in a TD-LTE arrangement with two downlink carriers as described above, the switching time is required to be significantly less than this, such as in the region of 20 μs for example.

It is an object of embodiments of the invention to address this need.

SUMMARY OF THE INVENTION

In accordance with at least one embodiment of the invention, methods, devices, systems and software are provided for supporting or implementing functionality to provide for the operation of a frequency synthesizer.

In a first exemplary embodiment of the invention, there is an apparatus comprising: a controller configured to: monitor a value of a first control signal associated with a first feedback loop which is connected to a signal generator, the first control signal being indicative of relatively fine frequency adjustments for the signal generator; based on the monitoring of the first control signal, to adjust a value of a second control signal associated with a second feedback loop connected to the signal generator, the second control signal being indicative of relatively less fine frequency adjustments for the signal generator; and provide an output signal for controlling a frequency of a signal generated by the signal generator, the output signal being based on the first and second control signals.

In a second exemplary embodiment of the invention, there is a method comprising: monitoring a value of a first control signal associated with a first feedback loop which is connected to a signal generator, the first control signal being indicative of relatively fine frequency adjustments for the signal generator; adjusting, based on the monitoring of the first control signal, a value of a second control signal associated with a second feedback loop connected to the signal generator, the second control signal being indicative of relatively less fine frequency adjustments for the signal generator; and providing an output signal for controlling a frequency of a signal generated by the signal generator, the output signal being based on the first and second control signals.

Further features and advantages of the invention will become apparent from the following description of preferred embodiments of the invention, given by way of example only, which is made with reference to the accompanying drawings.

BRIEF DESCRIPTION OF THE DRAWINGS

A frequency synthesizer will now be described as an embodiment of the present invention, by way of example only, with reference to the accompanying figures in which.

Several parts and components of the invention appear in more than one Figure; for the sake of clarity the same reference numeral will be used to refer to the same part and component in all of the Figures.

DETAILED DESCRIPTION OF ILLUSTRATIVE EMBODIMENTS OF THE INVENTION

In a first exemplary embodiment of the invention, there is an apparatus comprising: a controller configured to: monitor a value of a first control signal associated with a first feedback loop which is connected to a signal generator, the first control signal being indicative of relatively fine frequency adjustments for the signal generator; based on the monitoring of the first control signal, to adjust a value of a second control signal associated with a second feedback loop connected to the signal generator, the second control signal being indicative of relatively less fine frequency adjustments for the signal generator; and provide an output signal for controlling a frequency of a signal generated by the signal generator, the output signal being based on the first and second control signals.

In embodiments of the invention, the first control signal may be a fine frequency feedback signal received from a fine frequency feedback loop and used to provide a fine frequency control input to the signal generator or oscillator. Correspondingly, in embodiments of the invention, the second control signal may be a coarse or medium frequency feedback signal received from a coarse frequency feedback loop and used to provide a coarse/medium frequency control input to the signal generator. Advantageously, by monitoring the first control signal (fine frequency) and by adjusting the second control signal (coarse/medium frequency) based on the monitoring, the apparatus according to embodiments of the invention is able to maintain frequency lock through a wider range of changes (caused by e.g. temperature) without requiring the medium/coarse frequency feedback loop to be used to update the second control signal (since this is performed by the apparatus based on the monitoring). This saves power, and enables a stored second control value to be used, rather than one provided directly from the feedback loop, allowing for fast switching between frequencies by the signal generator when needed.

The controller may be configured to adjust a value of the first control signal based on the monitoring. When the second control signal is adjusted, the change in the second control signal might lead to a step change in the output of the signal generator. Advantageously, by adjusting the first control signal along with the second control signal, the embodiments of the invention are able to reduce disturbances in the output of the signal generator.

The controller may be configured to adjust values of the first and second control signals such that a change in the frequency of the signal generated by the signal generator associated with the adjustment of the value of the second control signal is compensated, at least partially, by a change in the frequency of the signal generated by the signal generator associated with the adjustment of the value of the first control signal.

By selecting the adjustments to compensate each other, the disturbance in the output of the signal generator or oscillator may be reduced, if not practically eliminated. In some embodiments, the adjustment to the second control signal will be a first value, and the adjustment in the first control signal will be a negative multiple of the adjustment to the second. The negative part indicates that the adjustments are opposed, i.e. one increases frequency, the other reduces it. The multiple may be selected based on the ratio of the frequency change caused by a unit change in the second control signal to the frequency change caused by a unit change in the first control signal.

The controller may be configured to adjust the first and second control values such that a magnitude of a change in the frequency of the signal provided by the signal generator associated with the adjustment is less than or equal to a magnitude of a change in the frequency of the signal provided by the signal generator associated with the first control value changing between adjacent values in a sequence of discrete values. In other words, the overall change in the frequency output by the signal generator from adjusting both control signals is equal to or less than the change which would be caused by a unit adjustment of the first control signal (fine frequency control signal).

The controller may be configured to compare the value of the first control signal to a predetermined range, and to adjust the values of the first and second control signals such that the value of the first control signal is adjusted to be within the predetermined range after said adjustment. The second control value may have one of a sequence of discrete values, and the adjustment to the second control value may adjust the second control value between adjacent values in the sequence of discrete values. In other words, the adjustment to the second control value may be a unit adjustment, or a change in the least significant bit.

The apparatus may comprise a memory configured to store data indicative of one or more values of the second control signal. The controller may be configured to retrieve data indicative of one of said one or more values of the second control signal from the memory and provide the output signal based on the retrieved data.

By storing and retrieving data indicative of one or more values of the second control signal, embodiments of the invention are able to reduce the lock in for a frequency synthesizer by removing the need to have a coarse frequency calibration step. This is particularly useful in combination with the monitoring and adjusting of the control signals as described above, since minor adjustments to the second control value which may be required can be performed on the stored value, rather than requiring a coarse frequency calibration step to be performed to update the stored value. The adjustments may be required due to, for example, minor temperature shifts between the point at which a given value was stored and a point at which the value was retrieved and used. A given one of the stored values may be identified in a retrieve signal.

The controller may be configured to store data indicative of a value of the second control signal at a first point in time in the memory, and retrieve data indicative of a value of the second control signal at a second point in time from the memory. Advantageously, embodiments of the invention may switch between frequencies by storing one value for e.g. the current point in time and retrieving a value from a previous point in time. This enables the lock in time for the new frequency to be short, while the value of the second control signal for the previous frequency is stored for later retrieval and use. This process may be cyclical, with two or more frequencies being switched between.

The apparatus may comprise a signal generator; a first feedback loop connected to the signal generator and configured to provide a first control signal indicative of relatively fine frequency adjustments for the signal generator to the controller; and a second feedback loop connected to the signal generator and configured to provide a second control signal indicative of relatively less fine frequency adjustments for the signal generator to the controller.

The first feedback loop may comprise a fine frequency tuning feedback loop. The first feedback loop may comprise a phase detector configured to determine a phase difference between an input reference signal and the output of the signal generator.

The second feedback loop may comprise one or more of a coarse frequency calibration feedback loop and at least one medium frequency calibration feedback loop. The second feedback loop may comprise a counter configured to determine a frequency difference between an input reference signal and the output of the signal generator.

The first and second control signals comprise digital words.

In a second exemplary embodiment of the invention, there is a method comprising: monitoring a value of a first control signal associated with a first feedback loop which is connected to a signal generator, the first control signal being indicative of relatively fine frequency adjustments for the signal generator; adjusting, based on the monitoring of the first control signal, a value of a second control signal associated with a second feedback loop connected to the signal generator, the second control signal being indicative of relatively less fine frequency adjustments for the signal generator; and providing an output signal for controlling a frequency of a signal generated by the signal generator, the output signal being based on the first and second control signals.

The method may comprise adjusting a value of the first control signal based on the monitoring. The method may comprise adjusting value of the first and second control signals such that a change in the frequency of the signal generated by the signal generator associated with the adjustment of the value of the second control signal is compensated, at least partially, by a change in the frequency of the signal generated by the signal generator associated with the value of the adjustment of the first control signal.

The method may comprise storing data indicative of one or more values of the second control signal in a memory. The method may comprise retrieving data indicative of one of said one or more values of the second control signal from the memory and providing the output signal based on the retrieved data.

The method may comprise storing data indicative of a value of the second control signal at a first point in time in the memory, and retrieving data indicative of a value of the second control signal at a second point in time from the memory.

The method may comprise determining a phase difference between an input reference signal and the output of the signal generator whereby to generate the first control signal.

The method may comprise determining a frequency difference between an input reference signal and the output of the signal generator whereby to generate the second control signal.

A schematic diagram of a frequency synthesizer in which embodiments of the invention may be used will now be described with reference to FIG. 2.

Figure 2:
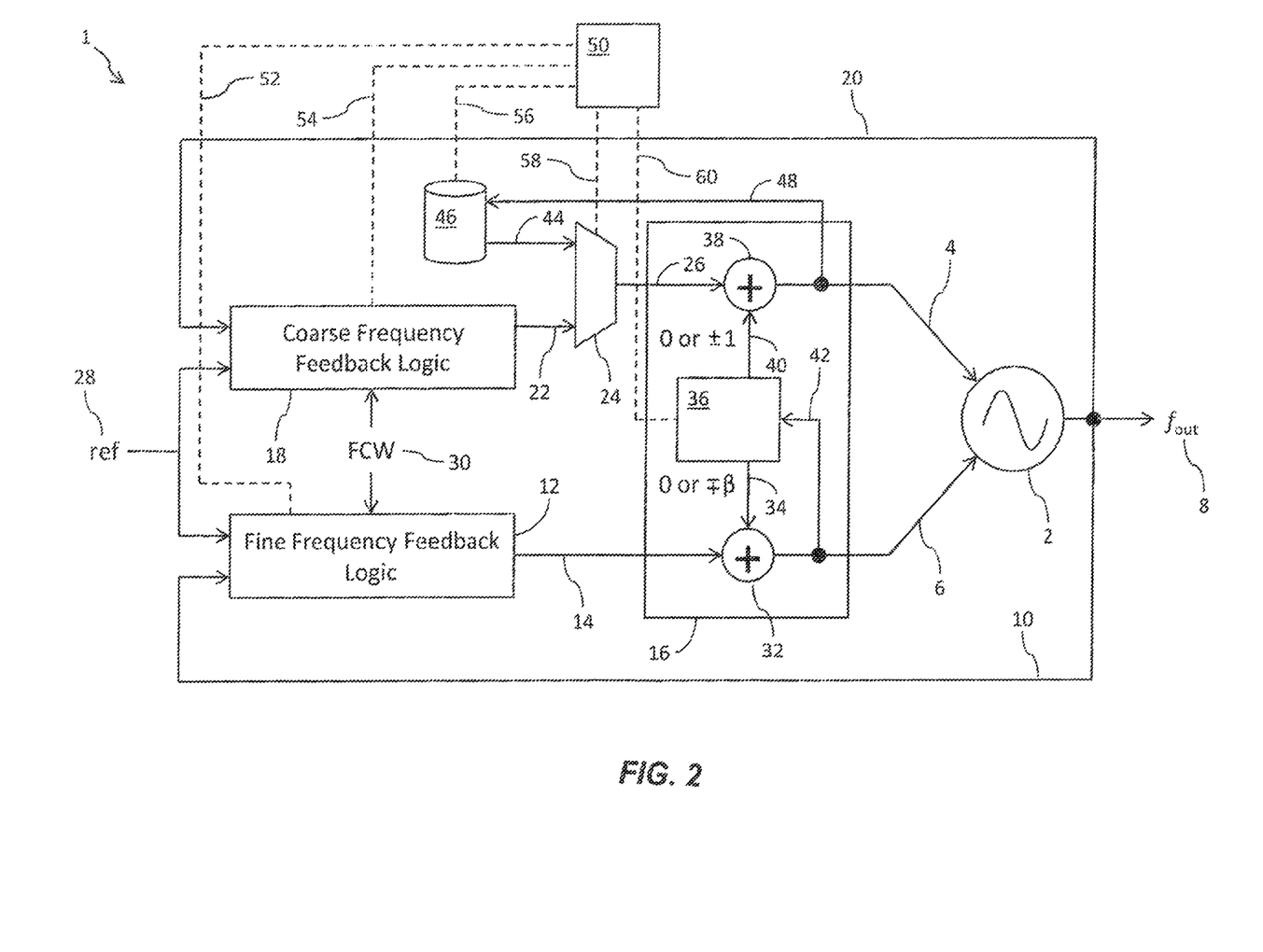
FIG. 2 shows a schematic diagram of a frequency synthesizer in which embodiments of the invention may be used.

In FIG. 2, a frequency synthesizer 1 has a signal generator 2, which in this example is a digitally controlled oscillator (DCO). The oscillator 2 receives a coarse frequency input signal 4 associated with a coarse frequency feedback loop (described below) and a fine frequency input signal 6 associated with a fine frequency feedback loop (described below). Based on the input, the signal generator 2 provides output frequency $f_{out}$ 8. It will be understood that coarse and fine are used here for clarity, and any system in which at least one relatively fine and at least one relatively less fine input signal is used is envisaged.

Connected to the output of the oscillator 2 is a fine frequency feedback loop. A first stage in this loop is represented by link 10 which connects the output 8 of the oscillator 2 to fine frequency feedback logic 12. The output signal 14 of the fine frequency feedback logic 12 is connected to adjustment unit 16. The adjustment unit 16 then provides, as an output based on signal 14, the input signal 6 to the oscillator 2. The adjustment unit 16 will be described in more detail below. In general the fine frequency feedback logic 12 provides a fine frequency control signal 6, which serves to control fine frequency adjustments to the oscillator 2.

In a similar fashion, a coarse frequency feedback loop is connected to the output of the oscillator 2. This coarse frequency feedback loop comprises coarse frequency feedback logic 18, which is connected to the output of the oscillator 2 by link 20. The output 22 of the coarse frequency feedback logic 18 is provided to a multiplexer 24, which in turn provides an output signal 26 to the adjustment unit 16. The adjustment unit 16 then provides, as an output based on signal 26, the input signal 4 to the oscillator 2. In general the coarse frequency feedback logic 18 provides a coarse frequency control signal 4, which serves to control coarse frequency adjustments to the oscillator 2.

Both of the fine frequency feedback logic 12 and the coarse frequency feedback logic 18 additionally receive a reference clock signal input 28 and a frequency control word (FCW) input 30.

Within the adjustment unit 16, a first summer 32 is connected to receive the output signal 14 from the fine frequency feedback logic 12, and provide, as its output, the fine frequency control signal 6 to the oscillator 2. The first summer 32 receives a further input signal 34 from monitoring and adjustment circuitry 36 within the adjustment unit 16. The summer being configured to add the two inputs 14 and 34.

A second summer 38 is also provided within the adjustment unit 16. This second summer receives as a first input the output 26 of the multiplexer 24, and a second input 40 from the monitoring and adjustment circuitry 36. The output of the summer 38 is provided as the coarse frequency control signal 4 to the oscillator 2.

The monitoring and adjustment circuitry 36, as well as providing the inputs 34 and 40 to the summers 32 and 38 respectively, monitors (via input 42) the output of the summer 32 (input signal 6 to the oscillator). The controller is therefore able to adjust the input signals 4 and 6 to the oscillator 2 by controlling the inputs 34 and 40 to the summers, and thereby add adjustment values to the signals.

In this example embodiment, the adjustment circuitry 36 may, for simplicity, operate in one of three modes. In a first mode the circuitry 36 causes no adjustment to be made to the control signals sent to the oscillator 2 (represented by the '0' next to the control signal). In a second mode, the circuitry 36 may cause a value of 1 to be added to the coarse frequency control signal, and for the value of $\beta$ to be subtracted from the fine frequency control signal. In the third mode, the circuitry 36 may cause a value of 1 to be subtracted from the coarse frequency control signal, and for the value of $\beta$ to be added to the fine frequency control signal. (It will however be apparent that other values, including multiples of 1, i.e. integers, and of $\beta$ may be used).

The multiplexer 24, as described above, receives one input from the coarse frequency feedback logic 18, and provides an output 26 to the adjustment unit 16. In addition, the multiplexer receives a second input 44 from a memory 46. The memory 46 is in turn connected to the output of the second summer 38 (which provides the input signal 4 to the oscillator 2), and is configured to receive and store this input value.

Finally, a controller 50 is provided. The controller has connections to: the fine frequency feedback logic 12 (connection 52), coarse frequency feedback logic 18 (connection 54); the memory 46 (connection 56); multiplexer 24 (connection 58); and circuitry 36 (connection 60).

The connections 52 and 54 to the feedback logic enable the controller to control whether these circuits operate. While the frequency control word is shown as being provided to the feedback logic separately (i.e. as reference 30), the controller 50 may itself provide these control words over connections 52 and 54.

The controller 50 may additionally control the memory 46 via connection 56 to store data based on the control signal 4 (received by the memory over connection 48). Additionally, the multiplexer may be controlled (via connection 58) to switch between inputs 22 and 44. Finally, the circuitry 36 within the adjustment unit 16 may also receive commands from the controller 50. These commands may activate or deactivate the adjustment unit 16.

Collectively the feedback loops provided through fine frequency feedback logic 12 and coarse frequency feedback logic 18 provide a phase locked loop (PLL) and operate according to known principles. In particular, the feedback logic compares the output 8 of the oscillator 2 to the reference signal input 28 and the frequency control word input 30. From this comparison a feedback signal is generated which controls the oscillator 2 to maintain the output 8 of the oscillator 2 to a desired frequency (specified by the frequency control word 30).

In this example embodiment, the phase locked loop may be an all digital phase locked loop, meaning that the signals provided within the frequency synthesizer are all-digital. That is, the signals comprise values or words made of a number of bits, or a word.

In one mode of operation, the multiplexer 24 may be controlled to pass the output of the coarse frequency feedback logic 18 to the adjustment unit 16. The adjustment unit 16 may be controlled to pass through (i.e. provide no adjustment to) the signals provided to it (signals 26 and 14). Consequently, the input control signals 4 and 6 to the oscillator 2 are the signals provided as the outputs from the fine frequency feedback logic 12 and coarse frequency feedback logic 18. In this mode, the frequency synthesizer 1 operates according to known principles.

Figure 3:
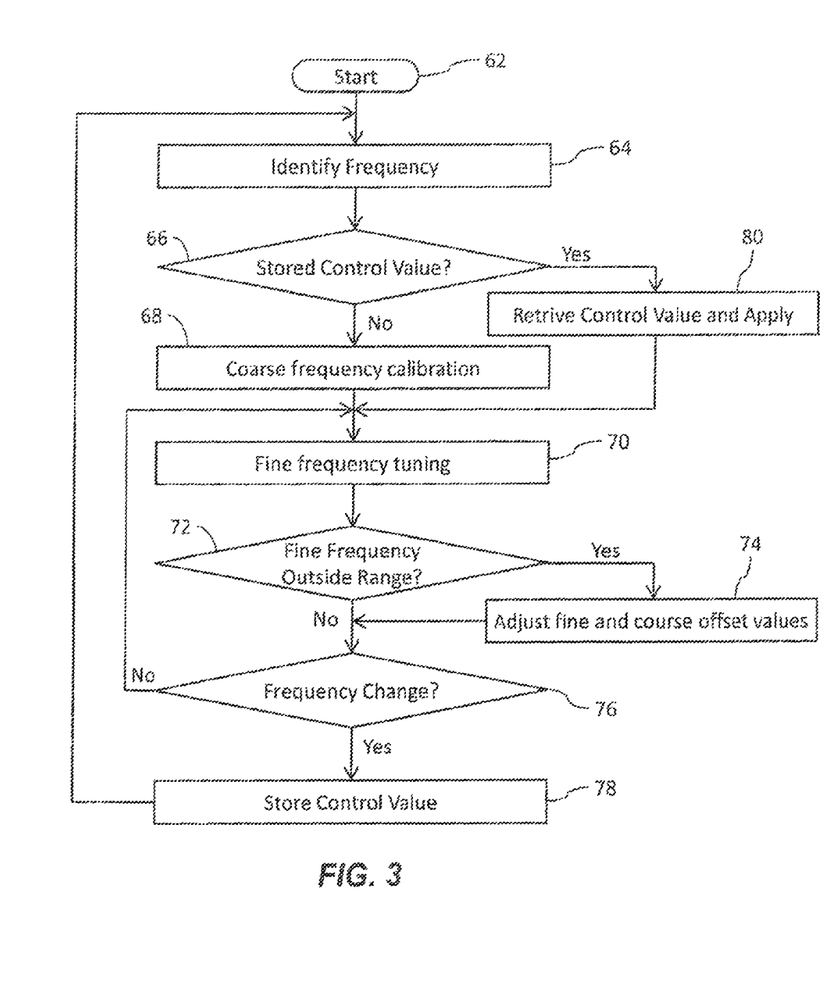
FIG. 3 shows a method according to embodiments of the invention.

The operation of the frequency synthesizer 1, in accordance with an embodiment of the invention, will now be described with reference to FIG. 3.

The process starts at step 62. For the purposes of this explanation, it will be assumed that this start point corresponds to power up of the device, or a substantial frequency change (as might be expected when changing channels, possibly caused by a change in radio access network or cell).

Consequently, in a step 64, the controller 50 identifies the frequency to which the frequency synthesizer 1 is to be tuned. In a second step 66, the controller 50 determines whether there are any stored control values for the identified frequency. This may be done by sending a signal to the memory 46.

In this case, as the process has just started, there are no stored control values (the nature of the stored control values will be described in more detail later). Consequently the process proceeds to step 68 in which coarse frequency calibration is performed. The controller 50 may control this by signalling the coarse frequency feedback logic 18, and by signalling the multiplexer to pass through the output 22 of the coarse frequency feedback logic 18. As is known in the art, coarse frequency tuning comprises a feedback process in which the output of the oscillator is tuned to an approximation of the frequency identified in step 64 (the frequency is an approximation as it is not phase locked). While only a coarse frequency calibration step is shown, the frequency calibration process may be split, into, for example, coarse and medium frequency calibration steps.

Having performed coarse frequency calibration in step 68, a fine frequency tuning step 70 is then performed. As is known in the art, a fine frequency tuning comprises a feedback process in which the output of the oscillator 2 is tuned so that there is phase lock between the reference signal and the output of the oscillator 2.

The process of fine frequency tuning is an ongoing one while the frequency synthesizer is locked to any particular frequency. As such, the output of the fine frequency feedback logic 12 may vary after each performance of step 70. During frequency lock, as represented in step 72, the monitoring and adjustment circuitry 36 may monitor the fine frequency control word being provided to the oscillator 2. This monitoring comprises comparing the fine frequency control value to a predetermined range. If the value of the fine frequency control signal is outside the range, then the circuitry 36 may, in step

74, adjust one or both of the fine and coarse control signals 4 and 6 by changing the values 34 and 40 provided to the summers 32 and 38.

For instance, if the fine frequency control word 6 is above the predetermined range, then the circuitry 36 may change the input 34 to the summer 32 (the summer in the fine frequency feedback loop) from zero (which is taken, in this example, to be the initial value) to the value of negative β. This change correspondingly brings the value on the control signal 6 down, and in some embodiments will bring the value to within the predetermined range. In addition, the circuitry 36 may change the input 40 to the summer 38 (the summer in the coarse frequency feedback loop) from zero (again the initial value) to positive 1.

Alternatively, if the fine frequency control word 6 is below the predetermined range, then the circuitry 36 may change the input 34 to the summer 32 from zero to positive β. This change correspondingly brings the value on the control signal 6 up, and in some embodiments will bring the value to within the predetermined range. In addition, the circuitry 36 may change the input 40 to the summer 38 from zero to negative 1.

In both cases, the value of β may be chosen so that the change in the coarse frequency control value (of ±1) is offset by, or compensated for, by the change in the fine frequency control value (of ±β). Therefore, the output frequency 8 of the oscillator 2 will have no change when the two adjustments are made. Alternatively, the change may be relatively small, and for example, be within the range of changes which may occur by a small step change in the fine frequency control signal 6.

The process of fine frequency tuning (step 70), and monitoring the fine frequency signal (step 72) to determine whether it is within the predetermined range, may then be repeated as long as the target frequency stays the same. This is represented by step 76, which determines if the frequency is unchanged, and if so causes a return to step 70.

If the frequency is changed, then in step 78, the coarse frequency control value 4 is stored in memory 46. The frequency change may be caused by a change from uplink to downlink channels as described above in the background section. The control unit 50 may cause the value of the coarse frequency control signal to be stored in memory by sending an appropriate 'store' command to the memory 46.

The above described process is then repeated for the new, second, frequency. This is represented by the process returning to step 64. The process is substantially the same for the new frequency. Consequently in step 64, the apparatus identifies the new frequency, and in step 66 determines whether a control value for this frequency is stored. Again, since the new frequency has not been used previously, there are no stored control values corresponding to that frequency, so coarse frequency calibration is performed in step 68, before the process proceeds to step 70 for fine frequency tuning.

Once again, during the period in which the frequency synthesizer is locked to the new, second frequency, the fine frequency signal is monitored and adjustments may be made by the adjustment unit 16 if required. At the end of the period of frequency lock it is determined in step 78 that the frequency has changed and the process returns, again, to step 64.

This time around, in step 64, (in this example) the frequency synthesizer is returning to providing the first frequency to which it was tuned to in the first case above. Therefore the first frequency is the one identified and in step 66, the controller determines that there is a control value for the identified frequency (since this was stored in the first iteration of step 78).

Since there is a stored control value, in step 80, the control value is retrieved from memory and provided to the oscillator 2. This may be done by controlling the memory 46 to output the stored control word, and by controlling the multiplexer to pass through the signal 44 from the memory to the adjustment unit 16 and on to the oscillator 2.

As the coarse frequency control word has been provided by the memory, there is no need for the coarse frequency calibration, so the next step performed is fine frequency tuning in step 70. The process of maintaining frequency lock (including monitoring the fine frequency signal in step 72) is therefore once again repeated until the frequency is again changed.

When the frequency again changes, the new value of the coarse frequency control signal is again stored in the memory, and the process returns to step 64. It will be noted that the value of the coarse frequency control signal may have changed (from the value previously provided by the memory), by virtue of the operation of the adjustment unit 16, as it is the output of this unit (i.e. of the summer 38) which is stored in the memory 46. Therefore the old coarse frequency value may be replaced by the new one (for that frequency).

On this fourth loop through the process, it will be assumed that the frequency synthesizer is returning to providing the second frequency. This, as with the first frequency, has been stored in memory. Therefore the value is retrieved and provided by the memory without the need to use the coarse frequency feedback logic.

The above process may be repeated many times, allowing the fast switching between the first and second frequencies.

The above embodiment therefore provides two advantages. The first is that, after the initial coarse frequency calibration for a given frequency, the lock in time is substantially reduced. This is because the coarse frequency calibration step is not required. The use of the stored data from the memory is particularly beneficial when there is a relatively short locking time required for switching between frequencies, as is performed in the TD-LTE process mentioned above.

Nevertheless, due to changes in, for example, temperature, minor changes in the control value provided by the memory may be required. Therefore, as a second advantage of the embodiment described above, any minor changes which may be required in the coarse frequency control value may provided by the adjustment unit 16 in step 74 be without requiring the coarse frequency calibration step 68 to be performed. This saves on both time to lock, and on power consumption, since the coarse frequency feedback logic 18 does not need to be activated.

A more detailed diagram of a frequency synthesizer according to an embodiment of the invention will now be described with reference to FIGS. 4 and 5. Where appropriate, like numerals have been provided to elements in these Figures which are similar to those in FIG. 2.

As with FIG. 2, a frequency synthesizer 1' has an oscillator 2 providing an output 8. The oscillator (or signal generator) 2 receives input signals. In this case the oscillator receives a fine frequency control signal 6, as well as a medium frequency control signal 4M and a coarse frequency control signal 4C. The oscillator produces an output frequency based on these signals.

Connected to the output of the oscillator 2 is a fine frequency feedback loop. A first stage in this loop is represented by connection 10 which connects the output 8 of the oscillator 2 to fine frequency feedback logic 12. In the example illustrated in FIG. 4, the fine frequency feedback logic is shown to have a phase-to-digital converter (PDC) 82, which may be based on a time-to-digital converter or TDC. The PDC 82 receives the output signal 10 from the oscillator 2 and the reference signal 28. The PDC 82 compares the transition edges of the oscillator output 10 and the reference signal 28 to determine the phase delay between the output of the oscillator 2 and the reference signal 28. The PDC 82 provides as an output a quantized phase of the oscillator 2 with respect to the reference 28. This output is provided to derivative unit 84 which in turn extracts frequency information from the phase information output by the PDC 82 by calculating a derivative of the phase delay signal. The output of the derivative unit 84 represents in the digital domain a ratio of the frequency of the output of the oscillator to the reference frequency. This output is provided to summer 86.

The summer 86 receives the input from the derivative unit 84 and combines it with the fine tuning frequency control word 30L. In this embodiment, the frequency control word has two parts, the fine tuning frequency control word 30L which is provided as an input to the fine frequency feedback logic 12, and a coarse/medium calibration frequency control word 30H which is provided to the coarse frequency feedback logic 18 (as will be described below). Together, the control words 30L and 30H represent the target frequency The summer 86 determines the difference (as shown by the + and − characters) between the fine tuning frequency control word 30L and input from the derivative unit 84, to calculate a frequency error. This frequency error is provided to a phase accumulator (PA) 88. The output of the phase accumulator 88 then represents a phase error. The phase error signal contains quantization noise originating from the phase quantization process. Therefore the phase error is provided to a digital loop filter (DLPF) 90, which suppresses the noise. The output of the loop filter 90 is provided as the output 14 of the fine frequency logic 12 to be used to correct the oscillator output frequency.

The detected frequency error is not an accurate representation of the actual frequency error, but instead is the superposition of the noise-like quantization error on the actual frequency error. This quantization error may contribution to output phase noise for the phase locked loop and consequently may provide unwanted feedback. If not filtered appropriately, the quantization error would propagate to the oscillator input and would be converted by the oscillator 2 to phase noise at the oscillator output 8. Therefore, it is the main purpose of the DLPF 90 to suppress such noise propagation. However, a side effect of the DLPF, depending on its bandwidth, is that it slows down the loop response for correction of a given frequency error.

As with FIG. 2, the output signal 14 of the fine frequency feedback logic 12 is connected to adjustment unit 16. The adjustment unit 16 then provides, as an output based on signal 14, the input signal 6 to the oscillator 2. The detail of the adjustment unit 16 will be described in more detail with reference to FIG. 5. In general the fine frequency feedback logic 12 provides a fine frequency control signal, which serves to control fine frequency adjustments to the oscillator 2.

Figure 4:
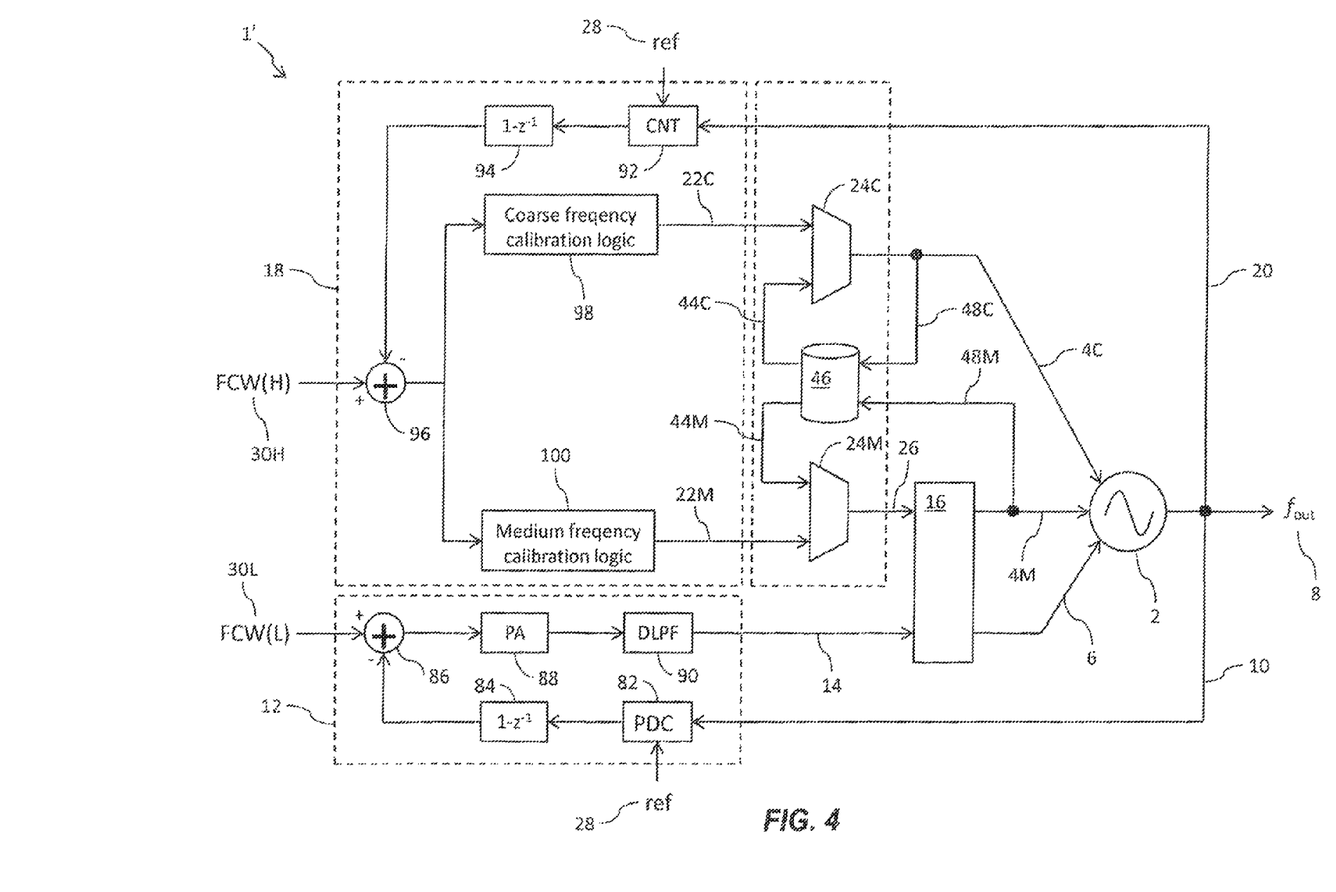
FIG. 4 shows a schematic diagram of a frequency synthesizer in which embodiments of the invention may be used.

In the circuit shown in FIG. 4, the coarse frequency feedback loop is again connected to the output of the oscillator 2. The output from the oscillator 2 is provided in a first instance to a counter (CNT) 92. This counter also receives the reference signal 28 as an input which serves as a clock signal that determines the sampling times of the phase information to be output from the counter. The counter compares the input signal 20 with the reference value 28 and provides an output to derivative unit 94. Derivative unit 94 in turn calculates a derivative of the signal.

The result is subsequently provided to a summer 96. This summer, as with summer 86, subtracts the input from derivative unit 94 from the coarse/medium calibration frequency control word 30H (as introduced above). The combined result is then passed to coarse frequency calibration logic 98 and also to medium frequency calibration logic 100. The coarse frequency calibration logic 98 and medium frequency calibration logic 100 both process the received data and provide output signals 22C and 22M respectively.

Therefore as with FIG. 2, the fine frequency feedback logic 12 receives the output from the oscillator, along with the appropriate frequency control word and the reference signal and provides a feedback signal 14. Three possible scenarios may be identified regarding the operation of the fine frequency feedback logic.

First, the oscillator output 8 may be higher than the target frequency (specified by the frequency control word 30). This means the detected digital frequency error is negative. The negative detected frequency error would decrease the phase error output by the accumulator, which in turn would decrease the input 6 to the oscillator 2 input and thus lower the frequency output by the oscillator. This goes on until the oscillator output frequency is no longer higher than the target frequency.

Secondly, the oscillator output 8 may be lower than target frequency (specified by the frequency control word 30). This means the detected digital frequency error is positive. The positive detected frequency error would increase the phase error output by the accumulator, which in turn would increase the input 6 to the oscillator 2. This goes on until the oscillator output frequency is no longer lower than the target frequency.

Thirdly, the oscillator output may be equal to the target frequency (specified by the frequency control word 30). When this occurs, the detected frequency error is zero, which would neither increase nor decrease the accumulated phase error output by the accumulator 88. As a result, the oscillator input 6 would remain unchanged. Theoretically, the phase locked loop may remain in this steady state; however, in real circuit operation, the oscillator output would not remain exactly at the target frequency, but instead would vary around the target frequency with small frequency errors.

Similarly the coarse frequency feedback logic 18 receives the output from the oscillator, along with the appropriate frequency control word and the reference signal, and provides feedback for the oscillator. However in this case, the feedback comprises a medium frequency signal 22M and a coarse frequency signal 22C. It will be apparent that, in combination, these two signals 22M and 22C provide a similar function to signal 22 in FIG. 2.

The coarse and medium frequency feedback signals 22C and 22M are subsequently passed to respective multiplexers 24C and 24M. The medium frequency multiplexer passes its output to the adjustment unit 16, while the coarse frequency multiplexer passes its output directly to the oscillator 2.

Memory 46 is provided. This memory may receive and store the values of the coarse 4C and medium 4M control signals provided to the oscillator. In addition, the memory may output stored coarse 44C and medium 44M control values to the inputs of the multiplexers 22C and 22M. As with FIG. 2, the multiplexers can select between the output of the calibration logic (i.e. the coarse feedback loop) and the values from the memory.

As with FIG. 2, a control unit may be provided, so as to control the memory and multiplexers. However, for simplicity in the diagram, such controlling elements are not shown.

The operation, the frequency synthesizer 1' shown in FIG. 4 is similar to that of frequency synthesizer 1 shown in FIG. 2 as described with reference to FIG. 3. The differences are that the coarse frequency calibration step 68 (in FIG. 3) includes two steps, that of coarse frequency calibration and a second step of medium frequency calibration. Similarly, it will be apparent that both the coarse and medium control values are stored and retrieved from memory in steps 78 and 80 respectively.

Finally, it will be apparent that only the medium control value is adjusted by the adjustment unit 16. This is because only the least significant bit or bits of the coarse and medium frequency control words need to be adjusted by the adjustment unit. In this case, these are the bits of the medium control values. It will further be apparent that more than the two coarse/medium feedback circuits may be provided.

One advantage of splitting the coarse frequency calibration into coarse and medium frequency is that the number of bits input into the adjustment unit 16 is reduced, thereby simplifying the adjustment unit 16.

A more detailed view of adjustment unit 16 according to an embodiment of the invention will now be described with reference to FIG. 5. As described above with reference to FIG. 4, the adjustment unit has medium frequency input 26 ($dtm_{in}$) and fine frequency input 14 ($dtf_{in}$). The unit 1 also provides medium frequency control signal output 4M ($dtm_{out}$) and fine frequency control signal output 6 ($dtf_{out}$).

Connected between the fine frequency input and output is a first (fine frequency) summer 32. The fine frequency summer 32 receives the input 14, and adds a first adjustment value to the input to provide the output 6. Similarly, connected between the medium frequency input and output is a second (medium frequency) summer 38. The medium frequency summer 38 receives the input 26, and adds a second adjustment value to the input to provide the output 4M.

Within the adjustment unit 16 is control circuitry 36. This control circuitry has a connection to the fine frequency output 6, and provides adjustment values to the summers 32 and 40 (in a similar manner to circuitry 36 shown in FIG. 2).

Within the control circuitry 36, two comparators 102 and 104 are connected to the fine frequency control signal output 6 via connection 42. The first comparator 102 compares the value of the output signal 6 to a predetermined threshold value (represented by +D) to determine whether the output value 6 is above the threshold. If the output value is above the value +D then the comparator unit 102 provides a signal to the 'up' input of an up-down counter 106. Similarly, the second comparator 104 compares the value of the output signal 6 to a predetermined threshold value (represented by −D) to determine whether the output value 6 is below the threshold. If the output value is below the value −D then the comparator unit 104 provides a signal to the 'down' input of up-down counter 106. It will be apparent that together, the two comparators 102 and 104 determine whether the signal is within the range from −D to +D, and provide appropriate up or down signals when the value of the control signal 6 is outside this range.

Up-down counter 106 therefore increases its output by one every time a signal is received on the up input, and decreases its output every time a signal is received on the down input. In any given clock cycle (or similar), at most one up/down operation will be performed (if one is at all) to allow for the effects of the change to propagate through to the fine output signal 6 (which consequently provides the input to the comparators 102 and 104).

The output of the up-down counter 106 is provided to delay unit 108, and from there provides the input 40 to the medium frequency summer 38. As will be apparent, the output of the up-down counter changes by one. Therefore each change will add or subtract one from the medium frequency control word, in other words, the change will change the least significant bit of the medium frequency control word 4M.

In addition, the output of the delay unit 108 is provided to a multiplier 110. Multiplier 110 multiplies the received value by −β, to provide the input to the first summer 32 of the negative of the input the second summer multiplied by β.

As such, each time the counter 106 increments by one, the value $dtm_{out}$ (output 4M) increases by one, and the value of $dtf_{out}$ (output 6) decreases by β. Similarly, each time the counter 106 decreases by one, the value $dtm_{out}$ (output 4M) decreases by one, and the value of $dtf_{out}$ (output 6) increases by β. The value of β may be chosen, as described above, to offset the change in the medium frequency output 4M.

Additional Details and Modifications

Figure 5:
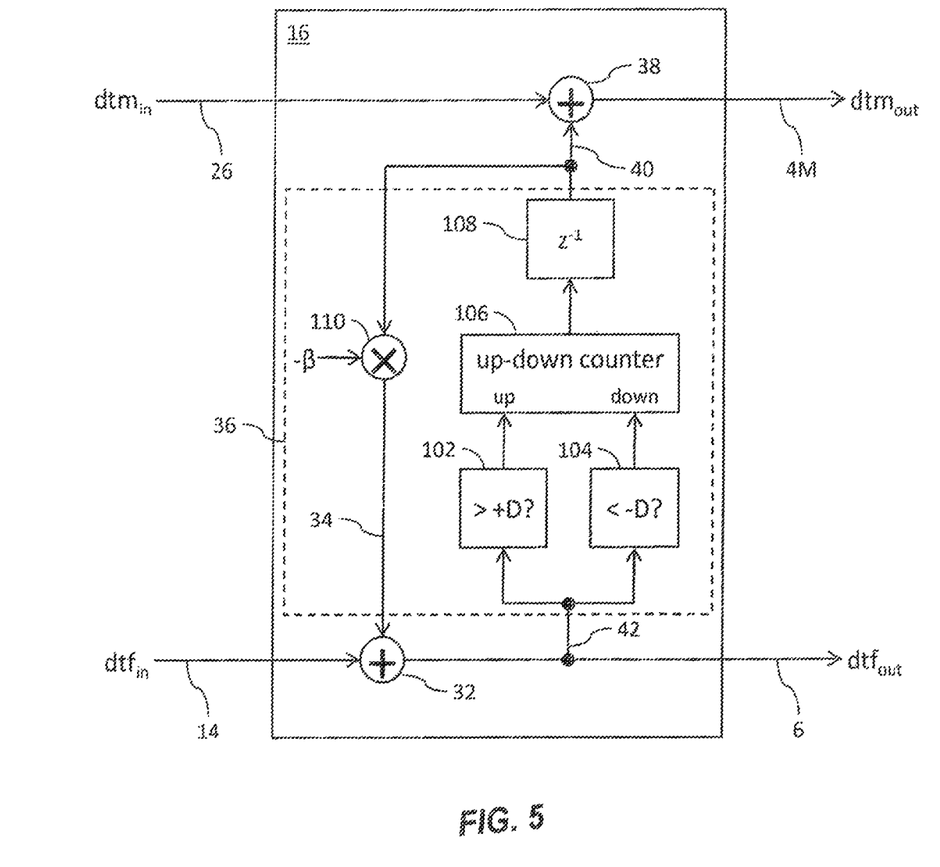
FIG. 5 shows a schematic diagram of an adjustment unit as shown in FIG. 4.

While the adjustment unit 16 described in relation to FIGS. 2 and 5 uses only single value increments to adjust the medium frequency output signal (and corresponding multiples thereof by β for the fine frequency output), it will be apparent that any appropriate adjustment may be made. For example, the unit 36 may select an appropriate adjustment value based on the difference between the threshold value D (or −D) and the control value $dtf_{out}$. This may be used to select an adjustment value to use in changing the adjustment signal. For example, the adjustment unit 16 may, in a single clock cycle, adjust $dtm_{out}$ by −3, and $dtf_{out}$ by +3β.

In the embodiments above, both the fine and medium control values are adjusted in a compensating manner. This has the advantage of provide a smooth adjustment, since the disturbances to the oscillator output frequency are small. However this may not always be done and only the medium frequency value may be adjusted, with the fine frequency feedback loop reacting to the step change in frequency and operating in its usual manner to adjust the fine frequency control value back to appropriate levels.

The arrangement and number of coarse and medium frequency feedback loops may differ. For example, embodiments of the invention may be used with a frequency synthesizer which has a coarse and two medium frequency feedback loops. Other arrangements in which single or multiple coarse frequency feedback loops are used with single or multiple medium frequency feedback loops are envisaged in embodiments of the invention. In some such embodiments, only one, or more than one of the medium frequency control signals may be adjusted by the adjustment unit 16. For instance, the adjustment unit 16 may initially adjust a first medium frequency control signal. However, should the adjustments made to the first medium frequency signal exceed a threshold, the adjustment unit may adjust both a first and a second medium frequency control signals. Other arrangements will be apparent to the skilled person.

The above descriptions relate to all digital frequency synthesizers using a direct digital synthesis oscillator (also known as a numerically-controlled oscillator, NCO). However it will be apparent that any appropriate oscillator may be used. For instance, a voltage controlled oscillator may be connected to a digital to analogue converter to provide the functionality of the oscillator/signal generator 2.

Similarly, while the above circuitry is described as being all-digital, it will be apparent that some parts of the circuitry may be analogue without departing from the scope of the invention. For instance, the fine frequency control signal 6 may be an analogue signal, and the comparators 102 and 104 may be arranged to compare the voltage level of the signal to predetermined voltages.

In the adjustment unit described in FIG. 5, the comparison is made between the range +D to −D. However this may not necessarily be the case and any appropriate values may be used. For instance, the control signal 6 may take a range of positive values, for instance 0 to $2^{16}$. In such cases, the values used in the comparators may be located around the midpoint of this range, for instance in having the values $2^{15} \pm 2^{14}$. In general, the range used in the comparison will be a subset of the total possible range of the control signal 6.

The above embodiments have been described with reference to only two stored control values (as would be used in the TD-LTE system described in the introduction). However this is not a limit on the invention, and many more frequencies may be used, for example in a frequency hopping system or similar. Particular applications in which embodiments of the invention may be used are:

TD-LTE with asymmetric UL/DL configurations (e.g. 2DL+1UL) requiring fast SX frequency retuning when switching between UL/DL modes;

In normal TD-LTE (1DL+1UL) configurations the coarse frequency feedback logic may be switched off, with minor adjustments to the coarse/medium frequency control word being made by the adjustment unit (thus saving power).

A special intra-band handover in TD-SCDMA, called Baton, requires a handover time in the region of 15 μs in cases where the timing-advance goes to zero. This handover time may be shorter than 15 μs, and in some systems may be 12.5 μs.

Monitoring, sensing, or calibration functions which can be implemented in radio if SX could be set to known frequency quickly.

Embodiments of the invention have been described in the context of a frequency synthesizer. It will be apparent that such a frequency synthesizer will have use in mobile communications equipment, a telecommunications device, which may be (but is not limited to) any of the following:

(a) wired and wireless telephones,
(b) satellite telephones,
(c) personal communication devices,
(d) electronic devices configured to share content in a local area network (LAN),
(e) electronic gaming devices,
(f) electronic music devices including, but not limited to, MP3 players and the like,
(g) telecommunications network infrastructure equipment, including but not limited to a base station,
(h) dual-mode cellular terminals which utilize a cellular network and a non-cellular network,
(i) other types of mobile devices or terminals,
(j) any machines configured for wireless communications in various applications, including but not limited to, smart homes, smart metering, fleet management, remote healthcare, or access network operation management, or
(k) any device used in a device-to-device connection.

In addition, while only TD-LTE has been mentioned, it will be apparent that any standard for wireless communications may utilize embodiments of the invention, these including (but not limited to) 2G, 3G (UMTS), CDMA, WiFi, TD-SCDMA, WiMax and LTE.

It will be understood that the processor or processing system or circuitry referred to herein may in practice be provided by a single chip or integrated circuit or plural chips or integrated circuits, optionally provided as a chipset, an application-specific integrated circuit (ASIC), field-programmable gate array (FPGA), etc. The chip or chips may comprise circuitry (as well as possibly firmware) for embodying at least one or more of a data processor or processors, a digital signal processor or processors, baseband circuitry and radio frequency circuitry, which are configurable so as to operate in accordance with the exemplary embodiments. In this regard, the exemplary embodiments may be implemented at least in part by computer software stored in (non-transitory) memory and executable by the processor, or by hardware, or by a combination of tangibly stored software and hardware (and tangibly stored firmware).

It is to be understood that any feature described in relation to any one embodiment may be used alone, or in combination with other features described, and may also be used in combination with one or more features of any other of the embodiments, or any combination of any other of the embodiments. Furthermore, equivalents and modifications not described above may also be employed without departing from the scope of the invention, which is defined in the accompanying claims. The features of the claims may be combined in combinations other than those specified in the claims.

The invention claimed is:

1. An apparatus comprising:
a controller configured to:
monitor a value of a first control signal associated with a first feedback loop which is connected to a signal generator, the first control signal being indicative of relatively fine frequency adjustments for the signal generator;
based on the monitoring of the first control signal, to adjust a value of a second control signal associated with a second feedback loop connected to the signal generator, the second control signal being indicative of relatively less fine frequency adjustments for the signal generator; and
provide an output signal for controlling a frequency of a signal generated by the signal generator, the output signal being based on the first and second control signals,
wherein the controller is configured to adjust a value of the first control signal based on the monitoring,
wherein the controller is configured to adjust values of the first and second control signals such that a change in the frequency of the signal generated by the signal generator associated with the adjustment of the value of the second control signal is compensated, at least partially, by a change in the frequency of the signal generated by the signal generator associated with the adjustment of the value of the first control signal.

2. The apparatus of claim 1, wherein the apparatus comprises a memory configured to store data indicative of one or more values of the second control signal.

3. The apparatus of claim 2, wherein the controller is configured to retrieve data indicative of one of said one or more values of the second control signal from the memory and provide the output signal based on the retrieved data.

4. The apparatus of claim 2, wherein the controller is configured to store data indicative of a value of the second control signal at a first point in time in the memory, and retrieve data indicative of a value of the second control signal at a second point in time from the memory.

5. The apparatus of claim 1, further comprising:
the signal generator;
the first feedback loop, wherein the first feedback loop is connected to the signal generator and is configured to provide to the controller the first control signal indicative of relatively fine frequency adjustments for the signal generator; and
the second feedback loop, wherein the second feedback loop is connected to the signal generator and is configured to provide to the controller the second control signal indicative of relatively less fine frequency adjustments for the signal generator.

6. The apparatus of claim 5, wherein the first feedback loop comprises a fine frequency tuning feedback loop.

7. The apparatus of claim 5, wherein the first feedback loop comprises a phase detector configured to determine a phase difference between an input reference signal and an output of the signal generator to provide the first control signal.

8. The apparatus of claim 5, wherein the second feedback loop comprises one or more of a coarse frequency calibration feedback loop and at least one medium frequency calibration feedback loop.

9. The apparatus of claim 5, wherein the second feedback loop comprises a counter configured to determine a frequency difference between an input reference signal and an output of the signal generator to provide the second control signal.

10. The apparatus of claim 1, wherein the first and second control signals comprise digital words.

11. A method comprising:
monitoring a value of a first control signal associated with a first feedback loop which is connected to a signal generator, the first control signal being indicative of relatively fine frequency adjustments for the signal generator;
adjusting a value of the first control signal based on the monitoring;
adjusting, based on the monitoring of the first control signal, a value of a second control signal associated with a second feedback loop connected to the signal generator, the second control signal being indicative of relatively less fine frequency adjustments for the signal generator;
adjusting values of the first and second control signals such that a change in the frequency of the signal generated by the signal generator associated with the adjustment of the value of the second control signal is compensated, at least partially, by a change in the frequency of the signal generated by the signal generator associated with the adjustment of the value of the first control signal; and
providing an output signal for controlling a frequency of a signal generated by the signal generator, the output signal being based on the first and second control signals.

12. The method of claim 11, comprising storing data indicative of one or more values of the second control signal in a memory.

13. The method of claim 12, comprising retrieving data indicative of one of said one or more values of the second control signal from the memory and providing the output signal based on the retrieved data.

14. The method of claim 12, comprising storing data indicative of a value of the second control signal at a first point in time in the memory, and retrieving data indicative of a value of the second control signal at a second point in time from the memory.

15. The method of claim 11, comprising determining a phase difference between an input reference signal and an output of the signal generator whereby to generate the first control signal.

16. The method of claim 11, comprising determining a frequency difference between an input reference signal and an output of the signal generator whereby to generate the second control signal.

17. An apparatus comprising:
a controller configured to:
monitor a value of a first control signal associated with a first feedback loop which is connected to a signal generator, the first control signal being indicative of relatively fine frequency adjustments for the signal generator;
based on the monitoring of the first control signal, to adjust a value of a second control signal associated with a second feedback loop connected to the signal generator, the second control signal being indicative of relatively less fine frequency adjustments for the signal generator; and
provide an output signal for controlling a frequency of a signal generated by the signal generator, the output signal being based on the first and second control signals; and
a memory configured to store data indicative of one or more values of the second control signal,
wherein the controller is configured to retrieve data indicative of one of said one or more values of the second control signal from the memory and provide the output signal based on the retrieved data,
wherein in response to the controller retrieving the data indicative of one of said one or more values of the second control signal from the memory, the controller is configured to provide the output signal based on the first control signal and the one of said one or more values of the second control signal, wherein the one of said one or more values of the second control signal is used as a basis for the output signal instead of the second control signal associated with the second feedback loop.

18. The apparatus of claim 17, wherein the controller is configured to adjust a value of the first control signal based on the monitoring, and wherein the controller is configured to adjust values of the first and second control signals such that a change in the frequency of the signal generated by the signal generator associated with the adjustment of the value of the second control signal is compensated, at least partially, by a change in the frequency of the signal generated by the signal generator associated with the adjustment of the value of the first control signal.

19. The apparatus of claim 17, further comprising:
the signal generator;
the first feedback loop, wherein the first feedback loop is connected to the signal generator and is configured to provide to the controller the first control signal indicative of relatively fine frequency adjustments for the signal generator; and
the second feedback loop, wherein the second feedback loop is connected to the signal generator and is configured to provide to the controller the second control signal indicative of relatively less fine frequency adjustments for the signal generator.

20. The apparatus of claim 19, wherein the second feedback loop comprises one or more of a coarse frequency calibration feedback loop and at least one medium frequency calibration feedback loop.

* * * * *

UNITED STATES PATENT AND TRADEMARK OFFICE
CERTIFICATE OF CORRECTION

| | |
|---|---|
| PATENT NO. | : 8,666,012 B2 |
| APPLICATION NO. | : 13/277305 |
| DATED | : March 4, 2014 |
| INVENTOR(S) | : Ari Vilander, Liangge Xu and Jouni Kristian Kaukovuori |

It is certified that error appears in the above-identified patent and that said Letters Patent is hereby corrected as shown below:

On the title page, please correct the spelling of the third listed inventor's name by replacing "Jounl" with --Jouni--.

Signed and Sealed this
Ninth Day of September, 2014

Michelle K. Lee
*Deputy Director of the United States Patent and Trademark Office*